United States Patent
Puthoor et al.

(10) Patent No.: US 11,056,211 B1
(45) Date of Patent: Jul. 6, 2021

(54) APPARATUS AND METHOD FOR HANDLING TEMPERATURE DEPENDENT FAILURES IN A MEMORY DEVICE

(71) Applicant: Western Digital Technologies, Inc., San Jose, CA (US)

(72) Inventors: Aneesh Puthoor, Bangalore (IN); Harvijay Singh, Bangalore (IN); Narendhiran Chinnaanangur Ravimohan, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/737,551

(22) Filed: Jan. 8, 2020

(51) Int. Cl.
| | |
|---|---|
| *G11C 29/50* | (2006.01) |
| *G11C 29/00* | (2006.01) |
| *G11C 16/26* | (2006.01) |
| *G11C 16/34* | (2006.01) |
| *G11C 29/42* | (2006.01) |

(52) U.S. Cl.
CPC ........ *G11C 29/50004* (2013.01); *G11C 16/26* (2013.01); *G11C 16/3445* (2013.01); *G11C 29/42* (2013.01); *G11C 29/702* (2013.01); *G11C 29/783* (2013.01); *G11C 29/88* (2013.01)

(58) Field of Classification Search
CPC .............. G11C 29/50004; G11C 16/26; G11C 16/3445; G11C 29/42; G11C 29/702
See application file for complete search history.

(56) References Cited

U.S. PATENT DOCUMENTS

| | | | |
|---|---|---|---|
| 2016/0133330 A1* | 5/2016 | Choe ........................ | G11C 7/04 365/185.29 |
| 2020/0073592 A1* | 3/2020 | Nishikawa ............. | G11C 16/26 |

* cited by examiner

*Primary Examiner* — Han Yang
(74) *Attorney, Agent, or Firm* — Volpe Koenig

(57) ABSTRACT

Devices, methods, and systems for managing temperature dependent failures in a memory device. An erase failure of a memory block is detected, and marked as a grown bad block if the memory device temperature is below a threshold temperature. If the temperature exceeds the threshold temperature, it is determined whether memory cells of the block exceed a first threshold voltage. If the memory cells of the block exceed the first threshold voltage, the block is marked as a potential grown bad block. If the memory cells of the block are below the first threshold voltage, it is determined whether a number of the memory cells of the block exceed a second threshold voltage. If the memory cells of the block are below the second threshold, the block is programmed. If the memory cells of the block exceed the second threshold, the block is marked for error correction and programmed.

20 Claims, 6 Drawing Sheets

APPARATUS AND METHOD FOR HANDLING TEMPERATURE DEPENDENT FAILURES IN A MEMORY DEVICE

FIELD OF INVENTION

This application relates to non-volatile memory devices, and more particularly, to managing temperature dependent failures of such devices.

BACKGROUND

Non-volatile memory devices typically include a number of memory cells implemented on a semiconductor die. Typically, the temperature of the memory increases under operational load. In some cases, the increased temperature can cause read, write, and/or erase operations to fail for the memory cells.

In some cases, a plurality of semiconductor dies is stacked within a package to increase the capacity of the memory. The thickness of one or more of the dies may be reduced in order to stack a greater number of dies in the package, to stack the same number of dies in a smaller sized package, or to stack the same number of dies of a different technology in the same sized package. However, a decrease in die thickness can make the dies more sensitive to high temperatures and increase leakage currents, which may cause voltages to clamp or NAND operations to fail.

SUMMARY

The present application is directed to devices, methods, and systems for managing temperature dependent failures in a memory device. An erase failure of a memory block is detected, and marked as a grown bad block if the memory device temperature is below a threshold temperature. If the temperature exceeds the threshold temperature, it is determined whether memory cells of the block exceed a first threshold voltage. If the memory cells of the block exceed the first threshold voltage, the block is marked as a potential grown bad block. If the memory cells of the block are below the first threshold voltage, it is determined whether a number of the memory cells of the block exceed a second threshold voltage. If the memory cells of the block are below the second threshold, the block is programmed. If the memory cells of the block exceed the second threshold, the block is marked for error correction and programmed.

DETAILED DESCRIPTION OF THE PREFERRED EMBODIMENTS

Figure 1A:
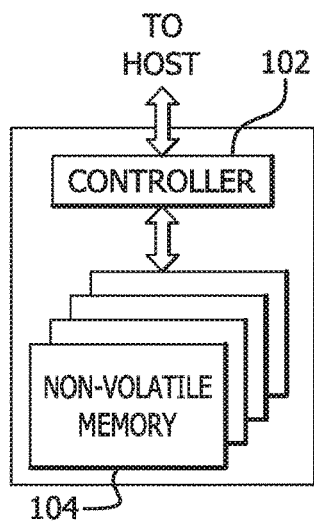
FIG. 1A is a block diagram illustrating an example non-volatile storage system.

Some implementations provide a memory device configured to manage temperature dependent failures. The memory includes circuitry configured to detect an erase failure of a memory block of the memory device. The memory also includes circuitry configured to mark the block as a grown bad block, if a temperature of the memory device does not exceed a threshold temperature. The memory also includes circuitry configured to determine whether memory cells of the block exceed a first threshold voltage, if the temperature exceeds the threshold temperature. The memory also includes circuitry configured mark the block as a potential grown bad block, if the memory cells of the block exceed the first threshold voltage. The memory also includes circuitry configured to determine whether a number of the memory cells of the block exceeds a second threshold voltage, if the memory cells of the block do not exceed the first threshold voltage. The memory also includes circuitry configured to program the block, if the memory cells of the block do not exceed the second threshold. The memory also includes circuitry configured to mark the block for error correction and program the block, if the memory cells of the block exceeds the second threshold.

In some implementations, the memory device also includes circuitry configured to mark the block as the grown bad block if the block is marked as the potential grown bad block, and if a second erase failure of the block is detected at a temperature below the threshold temperature. In some implementations, determining whether memory cells of the block exceed the first threshold voltage includes determining whether a threshold number of the memory cells of the block exceed the first threshold voltage. In some implementations, determining whether memory cells of the block exceed the second threshold voltage includes determining whether a threshold number of the memory cells of the block exceed the second threshold voltage. In some implementations, the memory device also includes circuitry configured to throttle a speed of the memory device if a number of memory blocks of the memory device marked as possible grown bad blocks exceeds a threshold number of bad blocks. In some implementations, the temperature of the memory device includes a junction temperature. In some implementations, the first threshold voltage and the second threshold voltage are based on a characteristic of the memory device. In some implementations, the first threshold voltage and the second threshold voltage are determined empirically. In some implementations, marking the block for error correction includes setting a soft bit window. In some implementations, marking the block for error correction includes increasing a size of a soft bit window.

Some implementations provide a method for managing temperature dependent failures in a memory device. The method includes detecting an erase failure of a memory block of the memory device. The method also includes marking the block as a grown bad block if a temperature of the memory device does not exceed a threshold temperature. The method also includes determining whether memory cells of the block exceed a first threshold voltage, if the temperature exceeds the threshold temperature. The method also includes marking the block as a potential grown bad block, if the memory cells of the block exceed the first threshold voltage. The method also includes determining whether a number of the memory cells of the block exceeds a second threshold voltage, if the memory cells of the block do not exceed the first threshold voltage. The method also includes programming the block, if the memory cells of the block do not exceed the second threshold. The method also includes marking the block for error correction and programming the block, if the memory cells of the block exceeds the second threshold.

In some implementations, the method includes marking the block as the grown bad block if the block is marked as the potential grown bad block and a second erase failure of the block is detected at a temperature below the threshold temperature. In some implementations, determining whether memory cells of the block exceed the first threshold voltage includes determining whether a threshold number of the memory cells of the block exceed the first threshold voltage. In some implementations, determining whether memory cells of the block exceed the second threshold voltage includes determining whether a threshold number of the memory cells of the block exceed the second threshold voltage. In some implementations, the method includes throttling a speed of the memory device if a number of memory blocks of the memory device marked as possible grown bad blocks exceeds a threshold number of bad blocks. In some implementations, the temperature of the memory device includes a junction temperature. In some implementations, the first threshold voltage and the second threshold voltage are based on a characteristic of the memory device. In some implementations, the first threshold voltage and the second threshold voltage are determined empirically. In some implementations, marking the block for error correction includes setting a soft bit window. In some implementations, marking the block for error correction includes increasing a size of a soft bit window.

Figure 1B:
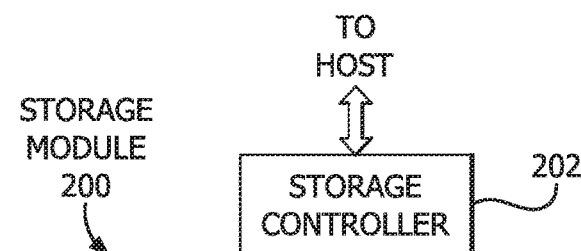
FIG. 1B is a block diagram illustrating an example storage module that includes plural non-volatile storage systems.
Figure 1B:
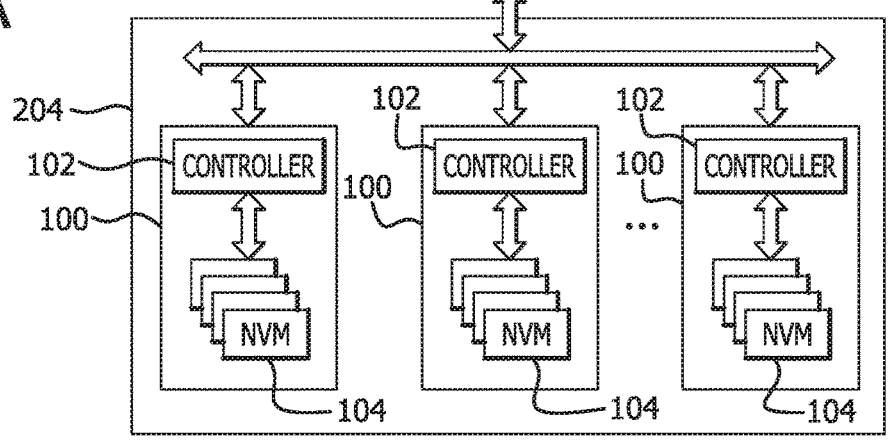
Figure 1C:
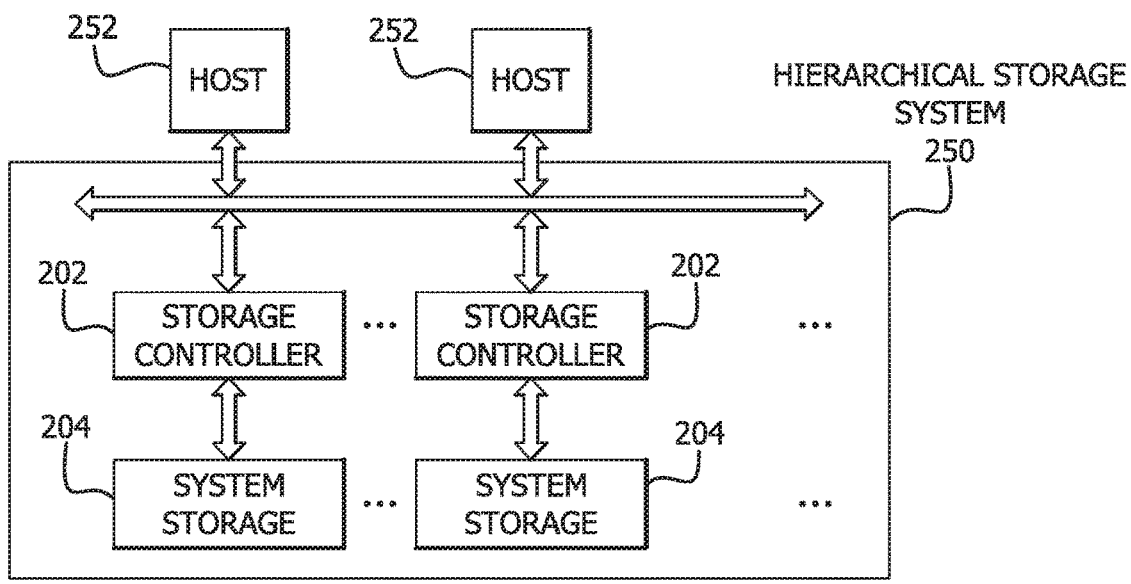
FIG. 1C is a block diagram illustrating an example hierarchical storage system.

Storage systems suitable for use in implementing aspects of these embodiments are shown in FIGS. 1A-1C. FIG. 1A is a block diagram illustrating an example non-volatile storage system 100 according to an example implementation of aspects of the subject matter described herein. Referring to FIG. 1A, non-volatile storage system 100 includes a controller 102 and non-volatile memory that may include one or more non-volatile memory dies 104. A die may include a collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

Controller 102 (which may include a non-volatile memory controller (e.g., a flash, ReRAM, PCM, or MRAM controller)) may include processing circuitry, a microprocessor or processor, and a computer-readable medium that stores computer-readable program code (e.g., firmware) executable by the microprocessor or processor, logic gates, switches, an application specific integrated circuit (ASIC), a programmable logic controller, and/or an embedded microcontroller, for example. Controller 102 can be configured with hardware and/or firmware to perform the various functions described below and shown in the flow diagrams. In some implementations, some of the components shown as being internal to the controller are stored external to the controller, and/or different components can be used. Additionally, the phrase "operatively in communication with" may mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. In some implementations, a non-volatile memory controller may include various functionality in addition to or instead of the specific functionality described herein. For example, the non-volatile memory controller may include hardware and/or software to format the non-volatile memory to ensure the memory is operating properly, map out bad non-volatile memory cells, and/or allocate spare cells to be substituted for future failed cells. In some implementations, a subset of the spare cells can be used to hold firmware to operate the non-volatile memory controller and implement other features. In some implementations, if a host needs to read data from or write data to the non-volatile memory, it communicates with the non-volatile memory controller to facilitate the read. In some implementations, if the host provides a logical address to which data is to be read/written, the non-volatile memory controller converts the logical address received from the host to a physical address in the nonvolatile memory. Alternatively, in some implementations, the host provides the physical address. The nonvolatile memory controller may also include hardware and/or software to perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In some implementations, storage system 100 may include a card based system, such as a secure digital (SD) or a micro secure digital (micro-SD) card. In some implementations, storage system 100 may be part of an embedded storage system.

Although, in the example illustrated in FIG. 1A, non-volatile storage system 100 (sometimes referred to herein as a storage module) is shown with a single channel between controller 102 and non-volatile memory die 104, the subject matter described herein is not limited to having a single memory channel. For example, in some storage system architectures (such as those shown in FIGS. 1B and 1C), any suitable number of memory channels (e.g., 2, 4, 8 or more memory channels) may exist between the controller and the memory device, depending on controller capabilities. It is noted that more than a single channel may exist between the controller and the memory die, even if a single channel is shown in the drawings.

FIG. 1B is a block diagram illustrating an example storage module 200 that includes a plurality of non-volatile storage systems 100. Storage module 200 may include a storage controller 202 that interfaces with a host and with storage system 204, which includes a plurality of nonvolatile storage systems 100. The interface between storage controller 202 and nonvolatile storage systems 100 may include a bus interface, such as a serial advanced technology attachment (SATA), peripheral component interface express (PCIe) interface, or dual-data-rate (DDR) interface. Storage module 200, in some implementations, may include a solid state drive (SSD), or a non-volatile dual in-line memory module (NVDIMM), e.g., as may be found in server PC or portable computing devices, such as laptop computers, and tablet computers.

FIG. 1C is a block diagram illustrating an example hierarchical storage system 250. Hierarchical storage system 250 includes a plurality of storage controllers 202, each of which controls a respective storage system 204. Host systems 252 may access memories within the storage system via a bus interface. In some implementations, the bus interface may be a non-volatile memory host controller interface specification express (NVMe) or fiber channel over Ethernet (FCoE) interface. In some implementations, the system illustrated in FIG. 1C may include a rack mountable mass storage system that is accessible by multiple host computers, e.g., as may be found in a data center or other location where mass storage is needed.

Figure 2A:
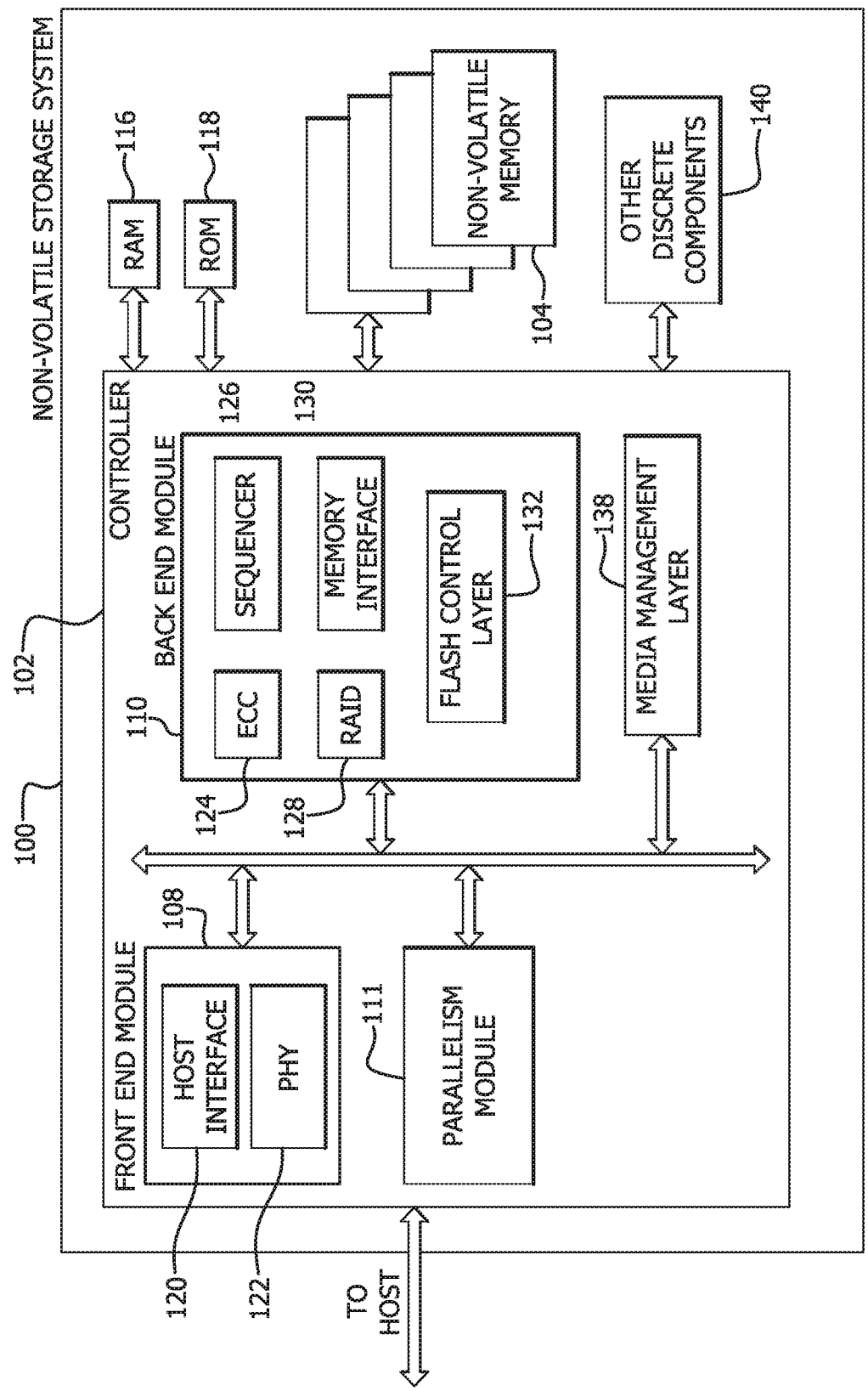
FIG. 2A is a block diagram illustrating components of an example controller.

FIG. 2A is a block diagram illustrating components of controller 102 in more detail. Controller 102 includes a front end module 108 that interfaces with a host, a back end module 110 that interfaces with the one or more non-volatile memory die 104, and various other components that perform functions which will now be described in detail. A component may include a packaged functional hardware unit designed for use with other components, a portion of a program code (e.g., software or firmware) executable by a processor, microprocesor, or processing circuitry that usually performs a particular function of related functions, and/or a self-contained hardware or software component that interfaces with a larger system, for example. Components of the controller 102 may include a parallelism module 111, which will be discussed in more detail below and can be implemented in hardware or software/firmware to perform the algorithms and methods discussed herein and shown in the attached drawings.

Referring again to modules of the controller 102, in some implementations, a buffer manager/bus controller manages buffers in random access memory (RAM) 116 and controls the internal bus arbitration of controller 102. A read only memory (ROM) 118 stores system boot code. Although illustrated in FIG. 2A as located separately from the controller 102, in some implementations one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provides an electrical interface with the host and/or next level storage controller. The choice of the type of host interface 120 may depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some implementations, the RAID module 128 may be a part of the ECC engine 124. A memory interface 130 provides the command sequences to non-volatile memory die 104 and receives status information from non-volatile memory die 104. In some implementations, memory interface 130 may be a double data rate (DDR) interface, such as a Toggle Mode 200, 400, or 800 interface. A flash control layer 132 controls the overall operation of back end module 110.

Storage system 100 also includes other discrete components 140. Components 140 may include external electrical interfaces, external RAM, resistors, capacitors, and/or other components that may interface with controller 102. In some implementations, one or more of the physical layer interface 122, RAID module 128, media management layer 138 and buffer management/bus controller are optional components that are not necessary in the controller 102.

Figure 2B:
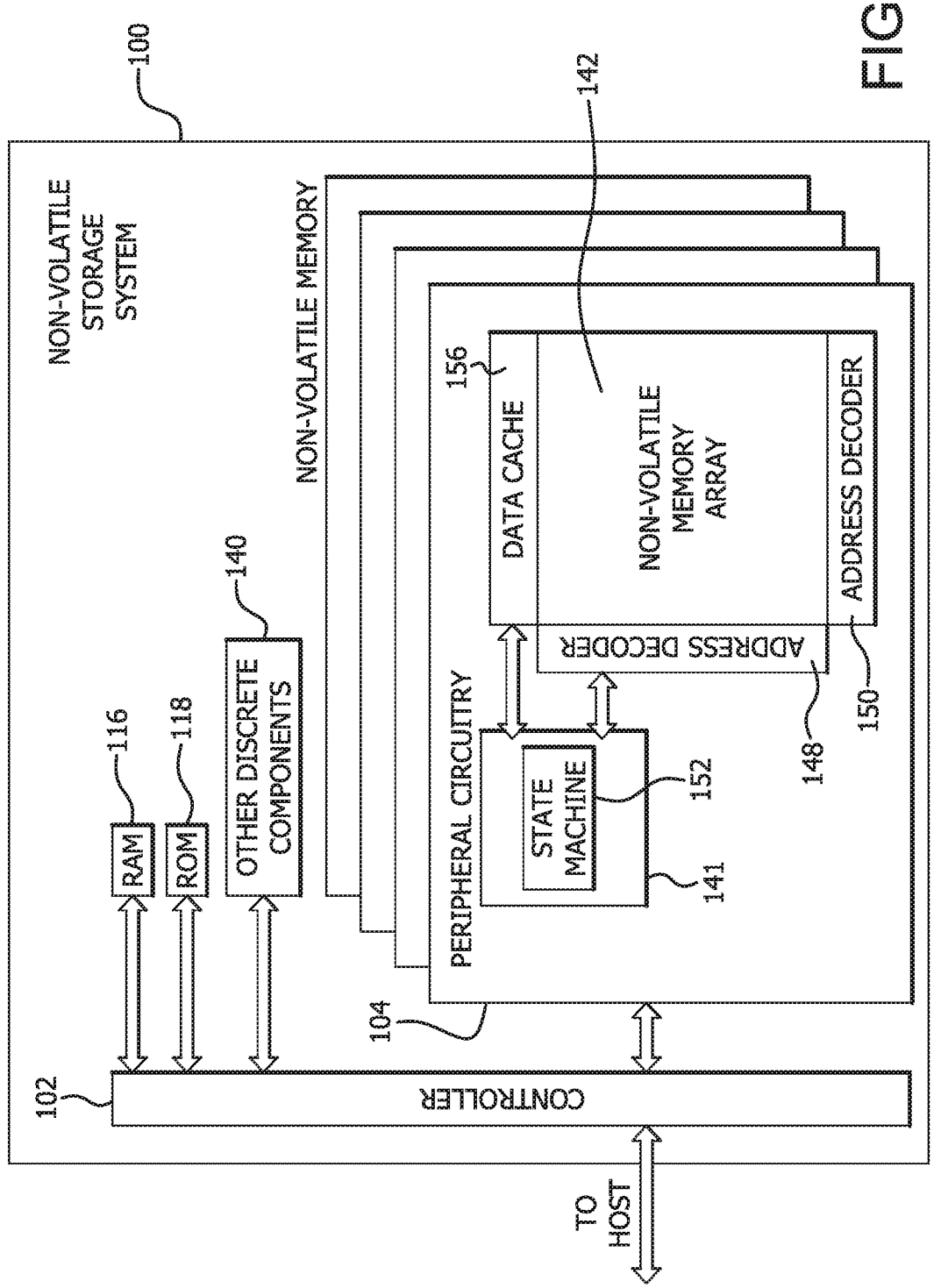
FIG. 2B is a block diagram illustrating components of an example non-volatile memory die.

FIG. 2B is a block diagram illustrating components of non-volatile memory die 104 in more detail. Non-volatile memory die 104 includes peripheral circuitry 141 and non-volatile memory array 142. Non-volatile memory array 142 includes the nonvolatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

The memory cells of non-volatile memory die 104 are organized as and/or may be accessed in blocks, where each block includes a number of the memory cells. For example, if non-volatile memory array 142 includes 2 gigabytes of flash memory cells (e.g., where each cell stores one bit), the storage can be organized as 248 blocks, with 64 pages per block, each page including 2112 bytes, each including 2048 byte data storage area and a 64 byte spare area. The 64 byte area is usable for any suitable purpose, such as error correction, wear leveling, or other functions. These dimensions are exemplary only; any suitable number of flash memory cells, blocks, pages, and bytes can be used. In some implementations, peripheral circuitry 141 includes at least one temperature sensor which is usable to sense or infer a temperature of the memory cells (e.g., junction temperature). In some implementations, the temperature sensor is located elsewhere on die 104 and/or storage system 100.

Various operations can be performed on the blocks of a non-volatile memory array, including block erase and programming operations. An erase operation writes all of the bit values of the cells in a block to one (or zero, depending on convention). In some implementations this is done by reducing the charge stored in each memory cell below a threshold voltage. The threshold voltage can be referred to as an erase verify level. In some implementations, a block erase command returns a status bit which indicates whether the block erase was successful. In some implementations, a separate command is used to determine the status of the block erase. The status typically indicates that the block erase was successful if the charged stored in each memory cell (or a threshold number of memory cells) of the block is below the erase verify level. If any (or a threshold number) of the memory cells has a charge with a voltage above the erase verify level, the status will indicate a block erase failure.

Block erase failures can arise due to various factors, and are typically classified as either hard or soft errors. Hard errors are permanent failures due to manufacturing defects or damage due to wear or other factors. A cell having a hard error is not reliable (e.g., cannot be erased or programmed reliably). Blocks which include hard errors can be referred to as "bad blocks" (BB). Those blocks which become bad (i.e., acquire hard errors) during the course of operation (e.g., due to wear) can be referred to as "developed bad blocks" or "grown bad blocks" (GBB).

Figure 3:
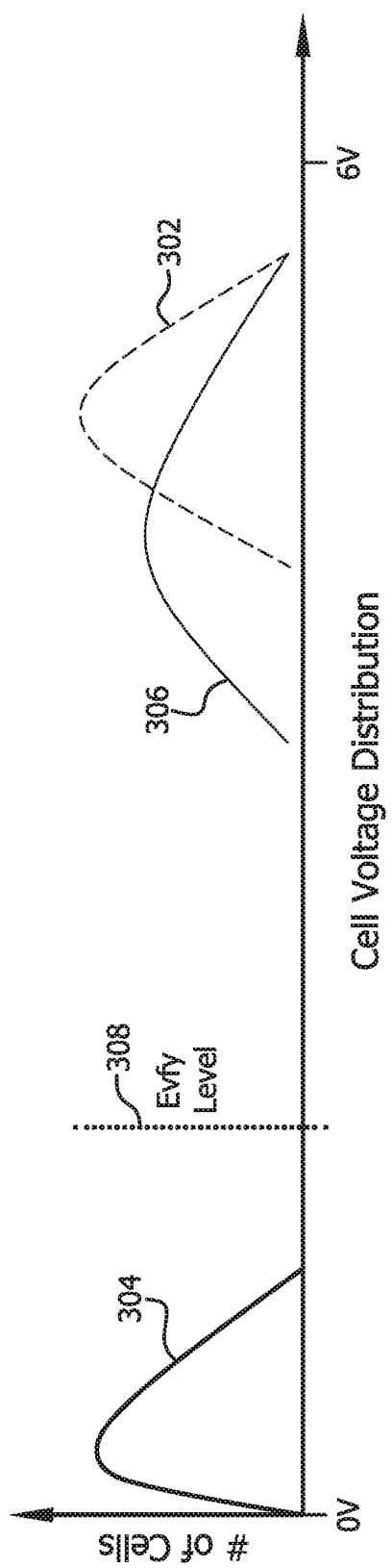
FIG. 3 is a line graph illustrating example cell voltage distributions of memory cells in a block.

FIG. 3 is a line graph 300 illustrating example cell voltage distributions 302, 304, 306 for memory cells under various circumstances. Distribution 302 illustrates a distribution of voltages for cells in a block which has been fully programmed, e.g., using a program command. Distribution 302 shows that the stored charges of all of the cells in the block have a voltage which exceeds an erase verify voltage level 308. Distribution 304 illustrates a distribution of voltages for the cells after having been fully erased, e.g., using a block erase command. Distribution 304 shows that the stored charges of all of the cells in the block have a voltage which is below the erase verify voltage level 304.

Distribution 306 illustrates a distribution of voltages for the cells after a failed erase operation, e.g., due to hard errors, or other errors. Distribution 306 shows that the stored charges of all of the cells in the block have a voltage which is above the erase verify voltage level 308, even though the voltages are lower than the programmed voltage levels illustrated by distribution 302. If the block exhibits a distribution of voltages above an erase verify voltage level (e.g., erase verify voltage level 308), the block may be considered to be a bad block or GBB.

Typically, bad blocks are marked as such in a header of the block, and/or in a list or table stored in a good block of the memory (and/or in system memory, or another suitable location). In some implementations, if a block is marked bad, it is removed from the logical mapping of the memory and a spare good block is substituted in the logical mapping. There are a limited number of spare good blocks, and thus the memory may be subject to failure if the number of spare good blocks is exceeded by the number of grown bad blocks. Accordingly, it may be advantageous in some circumstances to avoid marking blocks as bad unless they are confirmed to include hard errors.

A soft or transient error is a temporary failure where the cell is not reliable temporarily and/or under specific circumstances. Transient errors may occur due to particle strikes, electrostatic discharges, or charge leakage due to high temperature, for example. Temperature related transient errors may arise due to excessive temperatures of the transistor junctions of the memory cells. High junction temperatures can occur due to heavy usage of the memory array, excessive ambient temperatures, and so forth. Susceptibility of the memory cells to temperature related transient errors can be exacerbated by die thinning. For example, reducing the thickness of a die on which memory cells are implemented (e.g., by back grinding) can reduce the temperature at which the memory cell experiences unacceptable charge leakage, and may cause NAND operations, such as block erase operations, to fail in some cases.

In some implementations, soft errors due to temperature are avoided by preventing operation of the memory cells at a temperature where the memory cells are susceptible to soft errors. For example, in some implementations, junction temperatures are monitored using a temperature sensor located in periphery circuitry of the memory die, or in another suitable location. If the junction temperature exceeds a threshold temperature, the operation of the memory is halted or throttled (e.g., the speed and/or number of memory operations is reduced). In some cases, a staged approach is implemented where the operation of the memory is throttled at a first threshold temperature (e.g., 60 degrees centigrade), and halted at a second, higher threshold temperature (e.g., 70 degrees centigrade). The monitoring and/or halting and throttling may be controlled by a memory controller (e.g., controller 102 as shown and described with respect to FIGS. 1A-C and 2B) or any other suitable hardware and/or software.

Throttling and/or halting memory operations may cause the memory to fail product performance specifications for block budget or otherwise exhibit undesirable performance characteristics for applications where junction temperature (e.g., due to load or high ambient temperature) is expected to regularly exceed the threshold. Further, not throttling and/or halting memory operations may cause the memory to fail block budget specifications, if a large number of blocks are marked bad due to failures under temperature dependent soft-error conditions. Accordingly, it may be desired to handle soft errors due to temperature in a manner which avoids or mitigates these issues.

In some circumstances, a block which fails erase due to high temperature may not be immediately marked as a GBB, and may still be used for programming under certain circumstances. This may have the advantage of maintaining compliance with block budget and/or performance specifications.

In some implementations, a cell which fails erase due to high temperature is tested to determine whether it should be marked as a potential grown bad block (PGBB), or whether it can still be programmed successfully under the current conditions. Such a test can referred to as a "program feasibility read". In a program feasibility read, the controller or other suitable circuitry performs an erase operation on the block under test and senses the voltage level of the memory cells of the block. The distribution of the memory cells is compared with one or more voltage thresholds to determine whether the memory cells can be successfully programmed, and in some implementations, under what conditions the memory cells can be successfully programmed.

Figure 4:
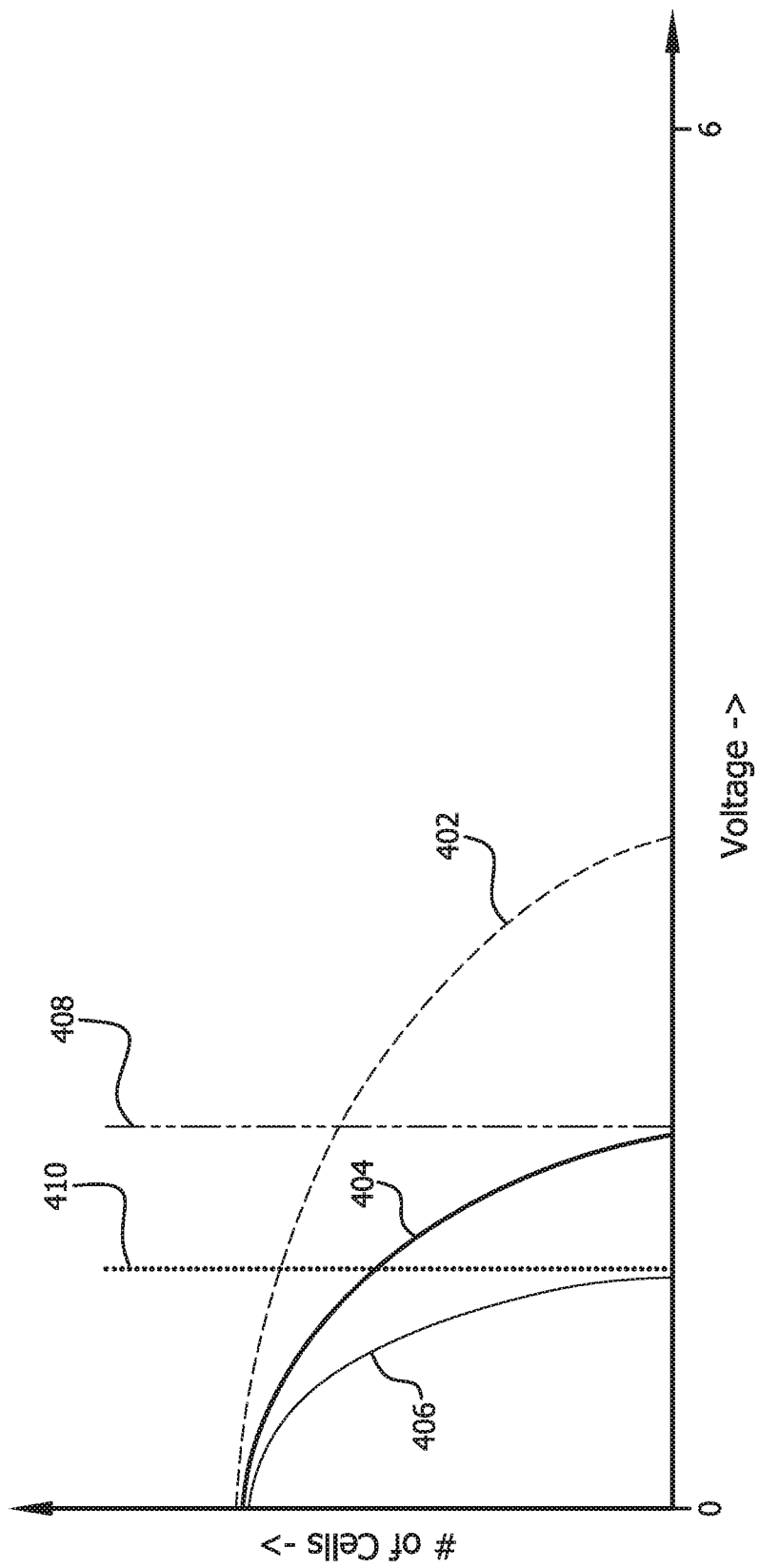
FIG. 4 is a line graph illustrating further example cell voltage distributions of memory cells in a block.

FIG. 4 is a line graph 400 illustrating example cell voltage distributions 402, 404, 406 for memory cells of a block during a program feasibility read. In some implementations, the memory cells of the block are tested using a program feasibility read if an erase operation fails while the junction temperature of the block exceeds a threshold $TH_{TEMP}$ (e.g., 100 degrees centigrade). During the program feasibility read of the block, an erase operation is performed on the block and the voltage level of the memory cells is sensed (e.g., by the controller or other suitable circuitry). The distribution of voltage levels of the memory cells is compared against a first threshold $TH_{READ1}$ 408 and a second threshold $TH_{READ2}$ 410 in this example. In some implementations, first threshold $TH_{READ1}$ 408 and second threshold $TH_{READ2}$ 410 are based on a characteristic of the memory cells, or are determined empirically.

If the distribution of voltage levels includes cells (or a threshold number of cells) which exceed $TH_{READ1}$ 408, the block may be considered to be a PGBB in some implementations. Distribution 402 illustrates a distribution of voltages for cells in a block where cells (or a threshold number of cells) have a voltage exceeding $TH_{READ1}$ 408. Accordingly, a block corresponding to distribution 402 is marked as a PGBB in some implementations. A PGBB can be marked as such in a header of the block, and/or a PGBB list or table stored in a good block of the memory (and/or in system memory, or another suitable location). In some implementations, a PGBB is treated as a GBB (i.e., not used for programming) under certain temperature conditions (e.g., above a threshold temperature $TH_{TEMP}$) and is tested again under other temperature conditions (e.g., below threshold temperature $TH_{TEMP}$) to determine whether or not to mark it as an actual GBB.

If the distribution of voltage levels includes cells (or a threshold number of cells) which exceed $TH_{READ2}$ 410, but do not exceed $TH_{READ1}$ 408, the block may be considered to be a "marginal failure" in some implementations. Distribution 404 illustrates a distribution of voltages for cells in a block where cells (or a threshold number of cells) have a voltage exceeding $TH_{READ2}$ 410, but not exceeding $TH_{READ1}$ 408. Accordingly, a block corresponding to distribution 404 is marked as a marginal failure in some implementations. A marginal failure can be marked as such in a header of the block, and/or a marginal failure list or table stored in a good block of the memory (and/or in system memory, or another suitable location). In some implementations, a marginal failure block can be reliably programmed, despite the erase failure, if error correction is used. In some implementations, the error correction includes setting a soft bit window, or increasing the size of a soft bit window.

If the distribution of voltage levels includes cells (or a threshold number of cells) which do not exceed $TH_{READ2}$ 410, the block may be considered to be a second type of marginal failure in some implementations. Distribution 406 illustrates a distribution of voltages for cells in a block where cells (or a threshold number of cells) have a voltage which does not exceed $TH_{READ2}$ 410. Accordingly, a block corresponding to distribution 406 is marked as a second type of marginal failure in some implementations. A second type of marginal failure can be marked as such in a header of the block, and/or a second type of marginal failure list or table stored in a good block of the memory (and/or in system memory, or another suitable location). In some implementations, a second type of marginal failure block can be reliably programmed (e.g., above the threshold temperature $TH_{TEMP}$), despite the erase failure and without error correction (or without additional error correction in some implementations).

Figure 5:
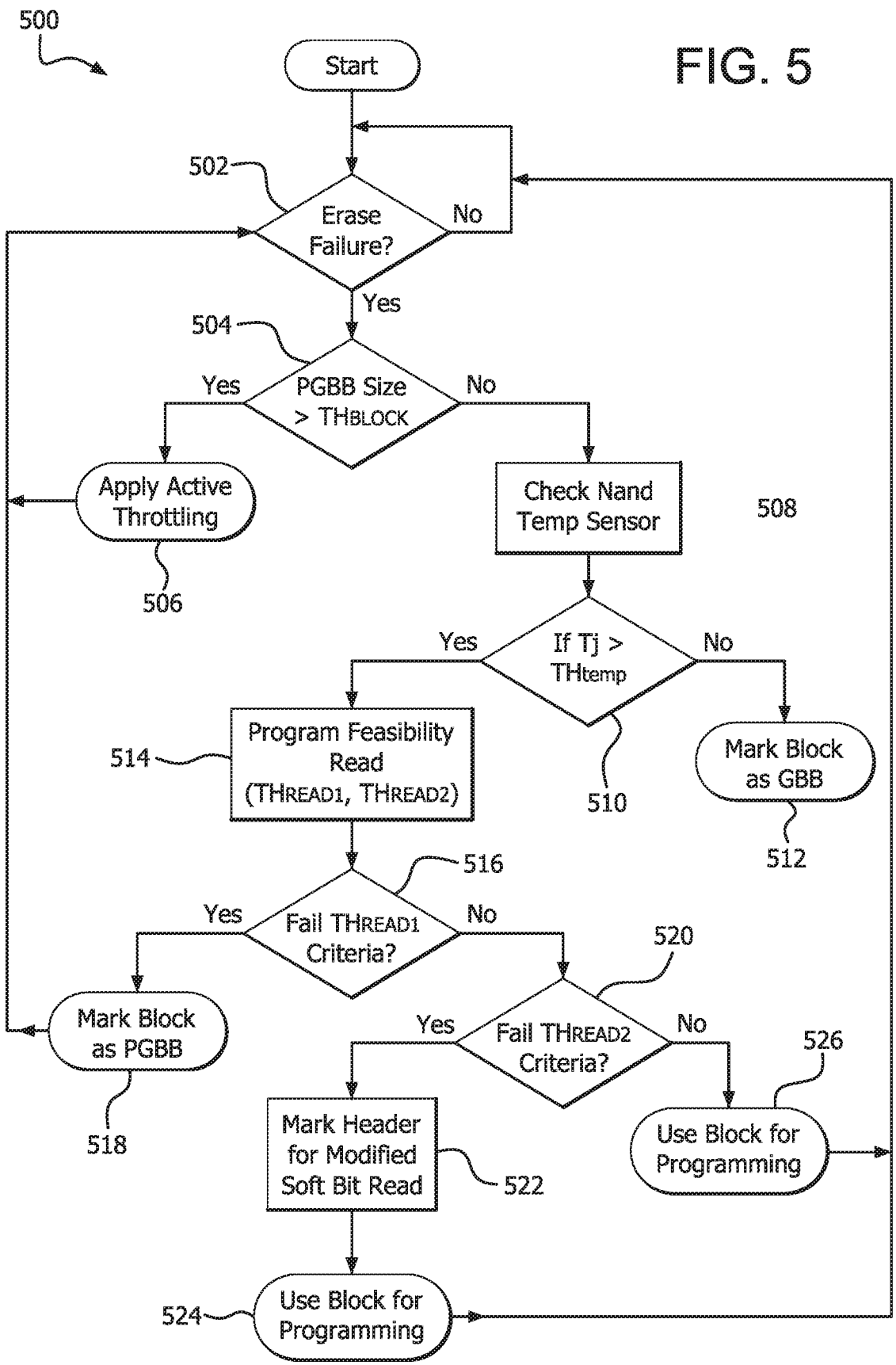
FIG. 5 is a flow chart illustrating an example method for managing temperature dependent block erase failures.

FIG. 5 is a flow chart illustrating an example method 500 for managing temperature dependent block erase failures. The various elements of method 500 are presented in an example order; however these elements can be performed in any suitable order, or separated, or combined, as appropriate. Any of the techniques discussed herein can be used for any of these elements, as appropriate.

On condition 502 that an erase failure is detected, it is determined whether a number of blocks in the memory that have been marked as PGBB is above a threshold (e.g., $TH_{BLOCK}$).

On condition 504 that the number of blocks in the memory that have been marked as PGBB is above the threshold, active throttling is applied in 506. On condition 504 that the number of blocks in the memory that have been marked as PGBB is not above the threshold, a temperature of the memory (e.g., junction temperature) is checked in 508.

On condition 510 that the temperature of the memory does not exceed a threshold temperature (e.g., $TH_{TEMP}$), the block under test is marked as a GBB in 512. Otherwise, on condition 510 that the temperature of the memory does exceed the threshold temperature, a program feasibility read operation is initiated in 514.

On condition 516 that the voltage distribution of the cells in the block exceeds a first threshold (e.g., $TH_{READ1}$), the block is marked as a PGBB in 518. Otherwise, on condition 520 that the voltage distribution of the cells in the block exceeds a second threshold (e.g., $TH_{READ2}$), the block is marked for error correction such as soft bit read, or additional error correction, such as an increased soft bit window (e.g., is marked as a second type of marginal failure as shown and described regarding FIG. 4) in 522 and used for programming in 524. On condition 518 that the voltage distribution of the cells in the block does not exceed the second threshold, the block is used for programming in 526.

It is noted that conditions 516 and 520 are illustrated separately for ease of description, but can be combined into one condition as desired. It is also noted that various implementations may use portions of method 500, or incorporate method 500 or portions thereof into another method.

It should be understood that many variations are possible based on the disclosure herein. Although features and elements are described above in particular combinations, each feature or element can be used alone without the other features and elements or in various combinations with or without other features and elements.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated.

What is claimed is:

1. A memory device configured to manage temperature dependent failures, the memory device comprising:
   circuitry configured to detect an erase failure of a memory block of the memory device;
   circuitry configured to, if a temperature of the memory device does not exceed a threshold temperature, mark the memory block as a grown bad block;
   circuitry configured to, if the temperature exceeds the threshold temperature, determine whether cell voltages of memory cells of the memory block exceed a first threshold cell voltage;
   circuitry configured to, if the cell voltages exceed the first threshold cell voltage, mark the memory block as a potential grown bad block;
   circuitry configured to, if the cell voltages do not exceed the first threshold cell voltage, determine whether a number of the cell voltages exceed a second threshold cell voltage;
   circuitry configured to, if the number of the cell voltages do not exceed the second threshold cell voltage, program the memory block; and
   circuitry configured to, if the number of the cell voltages exceed the second threshold cell voltage, mark the memory block for error correction and program the memory block.

2. The memory device of claim 1, further comprising circuitry configured to, if the memory block is marked as the potential grown bad block, mark the memory block as the grown bad block if a second erase failure of the memory block is detected at a temperature below the threshold temperature.

3. The memory device of claim 1, wherein determining whether the cell voltages exceed the first threshold cell voltage comprises determining whether cell voltages of a threshold number of the memory cells of the memory block exceed the first threshold cell voltage.

4. The memory device of claim 1, wherein determining whether the cell voltages exceed the second threshold cell voltage comprises determining whether cell voltages of a threshold number of the memory cells of the memory block exceed the second threshold cell voltage.

5. The memory device of claim 1, further comprising circuitry configured to throttle a speed of the memory device if a number of memory blocks of the memory device marked as possible grown bad blocks exceeds a threshold number of bad blocks.

6. The memory device of claim 1, wherein the temperature of the memory device comprises a junction temperature.

7. The memory device of claim 1, wherein the first threshold cell voltage and the second threshold cell voltage are based on a characteristic of the memory device.

8. The memory device of claim 1, wherein the first threshold cell voltage and the second threshold cell voltage are determined empirically.

9. The memory device of claim 1, wherein marking the memory block for error correction comprises setting a soft bit window.

10. The memory device of claim 1, wherein marking the memory block for error correction comprises increasing a size of a soft bit window.

11. A method for managing temperature dependent failures in a memory device, the method comprising:
    detecting an erase failure of a memory block of the memory device;
    if a temperature of the memory device does not exceed a threshold temperature, marking the memory block as a grown bad block;
    if the temperature exceeds the threshold temperature, determining whether cell voltages of memory cells of the memory block exceed a first threshold cell voltage;
    if the cell voltages exceed the first threshold cell voltage, marking the memory block as a potential grown bad block;
    if the cell voltages memory do not exceed the first threshold cell voltage, determining whether a number of the cell voltages exceed a second threshold cell voltage;
    if the number of the cell voltages do not exceed the second threshold cell voltage, programming the memory block; and
    if the number of the cell voltages exceed the second threshold cell voltage, marking the memory block for error correction and programming the memory block.

12. The method of claim 11, further comprising, if the memory block is marked as the potential grown bad block, marking the memory block as the grown bad block if a second erase failure of the memory block is detected at a temperature below the threshold temperature.

13. The method of claim 11, wherein determining whether the cell voltages exceed the first threshold cell voltage comprises determining whether cell voltages of a threshold number of the memory cells of the memory block exceed the first threshold cell voltage.

14. The method of claim 11, wherein determining whether the cell voltages exceed the second threshold cell voltage comprises determining whether cell voltages of a threshold number of the memory cells of the memory block exceed the second threshold cell voltage.

15. The method of claim 11, further comprising throttling a speed of the memory device if a number of memory blocks of the memory device marked as possible grown bad blocks exceeds a threshold number of bad blocks.

16. The method of claim 11, wherein the temperature of the memory device comprises a junction temperature.

17. The method of claim 11, wherein the first threshold cell voltage and the second threshold cell voltage are based on a characteristic of the memory device.

18. The method of claim 11, wherein the first threshold cell voltage and the second threshold cell voltage are determined empirically.

19. The method of claim 11, wherein marking the memory block for error correction comprises setting a soft bit window or increasing a size of the soft bit window.

20. A memory device, comprising:
    a memory including a plurality of memory cells; and
    means to detect an erase failure of a memory block of the memory, including:
        means to mark the memory block as a grown bad block, if a temperature of the memory device does not exceed a threshold temperature;
        means to determine whether cell voltages of memory cells of the memory block exceed a first threshold cell voltage, if the temperature exceeds the threshold temperature;
        means to mark the memory block as a potential grown bad block, if the cell voltages exceed the first threshold cell voltage;
        means to determine whether a number of the cell voltages exceed a second threshold cell voltage, if the cell voltages do not exceed the first threshold cell voltage;
        means to program the memory block, if the number of the cell voltages do not exceed the second threshold cell voltage; and
        means to mark the memory block for error correction and program the memory block, if the number of the cell voltages exceed the second threshold cell voltage.

* * * * *